US010068793B1

United States Patent
Kuo et al.

(10) Patent No.: US 10,068,793 B1
(45) Date of Patent: Sep. 4, 2018

(54) SEMICONDUCTOR STRUCTURE FOR PREVENTING GENERATION OF VOID AND METHOD FOR MANUFACTURING THE SAME

(71) Applicant: United Microelectronics Corp., Hsinchu (TW)

(72) Inventors: Chin-Chia Kuo, Tainan (TW); Ming-Hua Tsai, New Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/614,075

(22) Filed: Jun. 5, 2017

(30) Foreign Application Priority Data

May 2, 2017 (TW) .............................. 106114502 A

(51) Int. Cl.
| | |
|---|---|
| H01L 21/70 | (2006.01) |
| H01L 21/762 | (2006.01) |
| H01L 29/06 | (2006.01) |
| H01L 21/311 | (2006.01) |
| H01L 21/28 | (2006.01) |
| H01L 21/768 | (2006.01) |

(52) U.S. Cl.
CPC .. *H01L 21/76224* (2013.01); *H01L 21/28273* (2013.01); *H01L 21/311* (2013.01); *H01L 21/76283* (2013.01); *H01L 21/76802* (2013.01); *H01L 21/76834* (2013.01); *H01L 29/0649* (2013.01)

(58) Field of Classification Search
CPC .............. H01H 50/026; H01L 27/1463; H01L 27/14632; H01L 27/14634
See application file for complete search history.

(56) References Cited

U.S. PATENT DOCUMENTS

| | | | |
|---|---|---|---|
| 6,054,343 A | 4/2000 | Ashburn | |
| 7,371,656 B2 | 5/2008 | Seo | |
| 9,673,200 B2 * | 6/2017 | Kuo | ........................ H01L 27/11 |

* cited by examiner

*Primary Examiner* — Julio J Maldonado
*Assistant Examiner* — Andre' C Stevenson
(74) *Attorney, Agent, or Firm* — J.C. Patents

(57) ABSTRACT

A semiconductor structure including a substrate, an isolation structure, a first gate structure, a second gate structure and a protection layer is provided. The isolation structure is disposed on the substrate. The first gate structure and the second gate structure are adjacent to each other and disposed on the isolation structure. Each of the first gate structure and the second gate structure includes a conductive layer. The protection layer is disposed between the first gate structure and the second gate structure and covers the isolation structure between the first gate structure and the second gate structure.

19 Claims, 3 Drawing Sheets

SEMICONDUCTOR STRUCTURE FOR PREVENTING GENERATION OF VOID AND METHOD FOR MANUFACTURING THE SAME

CROSS REFERENCE TO RELATED APPLICATION

This application claims the priority benefits of Taiwan application serial no. 106114502, filed on May 2, 2017. The entirety of the above-mentioned patent application is hereby incorporated by reference herein and made a part of specification.

BACKGROUND OF THE INVENTION

1. Field of the Invention

The invention relates to a semiconductor structure and a method for manufacturing the same, and more particularly, to a semiconductor structure for preventing generation of void and a method for manufacturing the same.

2. Description of Related Art

Currently, in the process for removing film layers filled between gates (e.g., a buffer oxidation layer or a SAB (Self-Aligned Silicide Block) layer) and/or the subsequent washing process, a part of isolation structure between gate structures will be removed, making an aspect ratio of a space between the gate structures becoming greater.

Accordingly, with the aspect ratio of the space between the gate structures became greater, when film layers like contact etch stop layers (CESL) or dielectric layers are subsequent formed on the isolation structure between the gate structures, void and seam can be easily formed in aforesaid film layers. Consequently, in the subsequent process for forming contacts, conductive layers for forming the contacts will be filled into void or seam, causing a short circuit between the contacts.

SUMMARY OF THE INVENTION

The invention is directed to a semiconductor structure for preventing generation of void and a method for manufacturing the same, which are capable of effectively preventing generation of void or seam in the subsequently formed film layers.

The invention proposes a semiconductor structure for preventing generation of void, which includes a substrate, an isolation structure, a first gate structure, a second gate structure and a protection layer. The isolation structure is disposed on the substrate. The first gate structure and the second gate structure are adjacent to each other and disposed on the isolation structure. Each of the first gate structure and the second gate structure includes a conductive layer. The protection layer is disposed between the first gate structure and the second gate structure and covers the isolation structure between the first gate structure and the second gate structure.

According an embodiment of the invention, in the semiconductor structure for preventing generation of void, the isolation structure is, for example, a shallow trench isolation (STI) structure.

According an embodiment of the invention, in the semiconductor structure for preventing generation of void, each of the first gate structure and the second gate structure further includes a dielectric layer. The dielectric layer is disposed between the conductive layer and the isolation structure.

According an embodiment of the invention, in the semiconductor structure for preventing generation of void, each of the first gate structure and the second gate structure further includes a spacer. The spacer is disposed on a sidewall of the conductive layer.

According an embodiment of the invention, in the semiconductor structure for preventing generation of void, each of the first gate structure and the second gate structure further includes a metal silicide layer. The metal silicide layer is disposed on the conductive layer.

According an embodiment of the invention, in the semiconductor structure for preventing generation of void, the protection layer can be a SAB (Self-Aligned Silicide Block) layer.

According an embodiment of the invention, in the semiconductor structure for preventing generation of void, a material of the protection layer is, for example, a silicon nitride (SiN) or a silicon oxynitride (SiON).

According an embodiment of the invention, in the semiconductor structure for preventing generation of void, a shape of the protection layer is, for example, a saddle shape.

According an embodiment of the invention, in the semiconductor structure for preventing generation of void, a top surface of the isolation structure covered by the protection layer is, for example, higher than a top surface of the isolation structure not covered by the protection layer.

According an embodiment of the invention, in the semiconductor structure for preventing generation of void, the protection layer may further cover a sidewall of the first gate structure and a sidewall of the second gate structure.

According an embodiment of the invention, in the semiconductor structure for preventing generation of void, the protection layer does not cover a top portion of the first gate structure and a top portion of the second gate structure in a semiconductor device area predetermined for forming a metal silicide, for example.

According an embodiment of the invention, in the semiconductor structure for preventing generation of void, a top portion of the protection layer is, for example, lower than a top portion of the first gate structure and a top portion of the second gate structure.

According an embodiment of the invention, in the semiconductor structure for preventing generation of void, the protection layer does not cover any active area in a semiconductor device area predetermined for forming a metal silicide, for example.

According an embodiment of the invention, in the semiconductor structure for preventing generation of void, a buffer layer is further included. The buffer layer is disposed between the protection layer and the isolation structure.

The invention proposes a method for manufacturing semiconductor structure for preventing generation of void, which includes the following steps. An isolation structure is formed on a substrate. A first gate structure and a second gate structure adjacent to each other are formed on the isolation structure. Each of the first gate structure and the second gate structure includes a conductive layer. A protection layer is formed between the first gate structure and the second gate structure. The protection layer covers the isolation structure between the first gate structure and the second gate structure.

According an embodiment of the invention, in the method for manufacturing semiconductor structure for preventing generation of void, a method for forming the protection layer includes the following steps. A protection material layer is conformally formed on the first gate structure and the second gate structure. The protection material layer covers the isolation structure. A patterned photoresist layer is formed on the protection material layer between the first gate structure and the second gate structure. The protection material layer not covered by the patterned photoresist layer is removed.

According an embodiment of the invention, in the method for manufacturing semiconductor structure for preventing generation of void, the patterned photoresist layer does not cover any active area in a semiconductor device area predetermined for forming a metal silicide, for example.

According an embodiment of the invention, in the method for manufacturing semiconductor structure for preventing generation of void, a method for removing the protection material layer not covered by the patterned photoresist layer is, for example, a dry etching method.

According an embodiment of the invention, the semiconductor structure for preventing generation of void further includes forming a buffer material layer on the first gate structure and the second gate structure conformally before forming the protection material layer. The buffer material layer covers the isolation structure.

According an embodiment of the invention, the method for manufacturing semiconductor structure for preventing generation of void further includes removing the buffer material layer not covered by the patterned photoresist layer to form a buffer layer.

Based on the above, in the semiconductor structure for preventing generation of void and the method for manufacturing the same proposed by the invention, the protection layer is disposed between the first gate structure and the second gate structure, and covers the isolation structure between the first gate structure and the second gate structure. Therefore, the protection layer can protect the isolation structure therebelow to prevent the isolation structure between the first gate structure and the second gate structure from being removed. Accordingly, the protection layer can effectively prevent the aspect ratio of the space between the first gate structure and the second gate structure from becoming greater to prevent generation of void and seam in the film layers formed in aforesaid space, so as to prevent the short circuit between the contacts.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
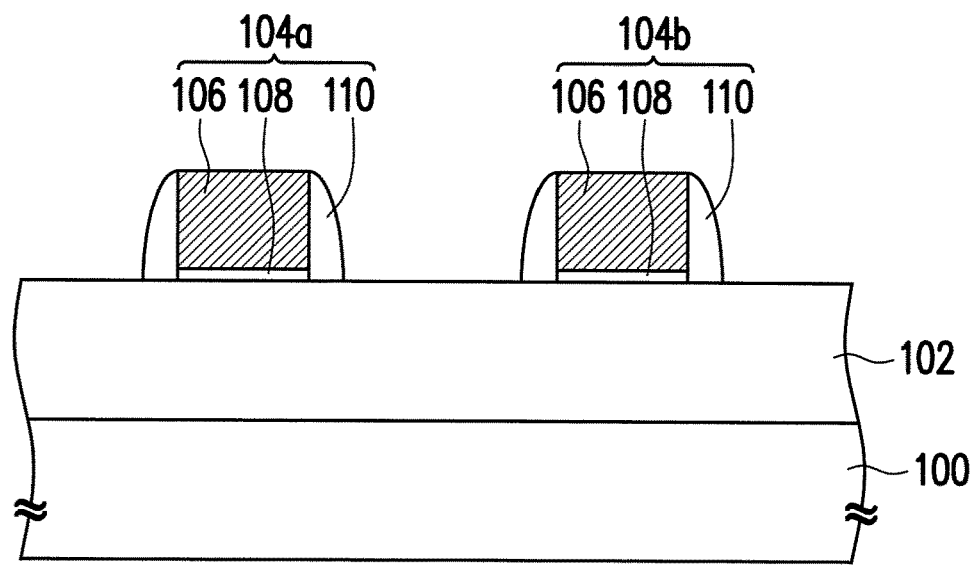
FIG. 1A to FIG. 1D are cross-sectional views illustrating a manufacturing process for a semiconductor structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1D are cross-sectional views illustrating a manufacturing process for a semiconductor structure according to an embodiment of the invention.

With reference to FIG. 1A, an isolation structure 102 is formed on a substrate 100. The substrate 100 is, for example, a semiconductor substrate, such as a silicon substrate. The isolation structure 102 is, for example, a shallow-trench isolation structure. A material of the isolation structure 102 is, for example, a silicon oxide. A method for forming the isolation structure 102 is, for example, to perform a manufacturing process for the shallow-trench isolation structure.

A gate structure 104a and a gate structure 104b adjacent to each other are formed on the isolation structure 102. Each of the gate structure 104a and the gate structure 104b includes a conductive layer 106. The conductive layer 106 can serve as a gate. A material of the conductive layer 106 is, for example, a doped polysilicon. A method used for forming the conductive layer 106 is, for example, a chemical vapor deposition method.

In addition, each of the gate structure 104a and the gate structure 104b can further include at least one of a dielectric layer 108 and a spacer 110. The dielectric layer 108 is disposed between the conductive layer 106 and the isolation structure 102. The dielectric layer 108 can serve as a gate dielectric layer. A material of the dielectric layer 108 is, for example, a silicon oxide. A method for forming the dielectric layer 108 is, for example, a thermal oxidation method or a chemical vapor deposition method.

The spacer 110 can be a single layer structure or a multi layer structure. A material of the spacer 110 is, for example, a silicon nitride, a silicon oxide or a combination thereof. A method for forming the spacer 110 includes, for example, forming a spacer material layer covering the conductive layer 106 first and then performing an etching back process on the spacer material layer. A method for forming the spacer material layer is, for example, a chemical vapor deposition method.

Figure 1B:
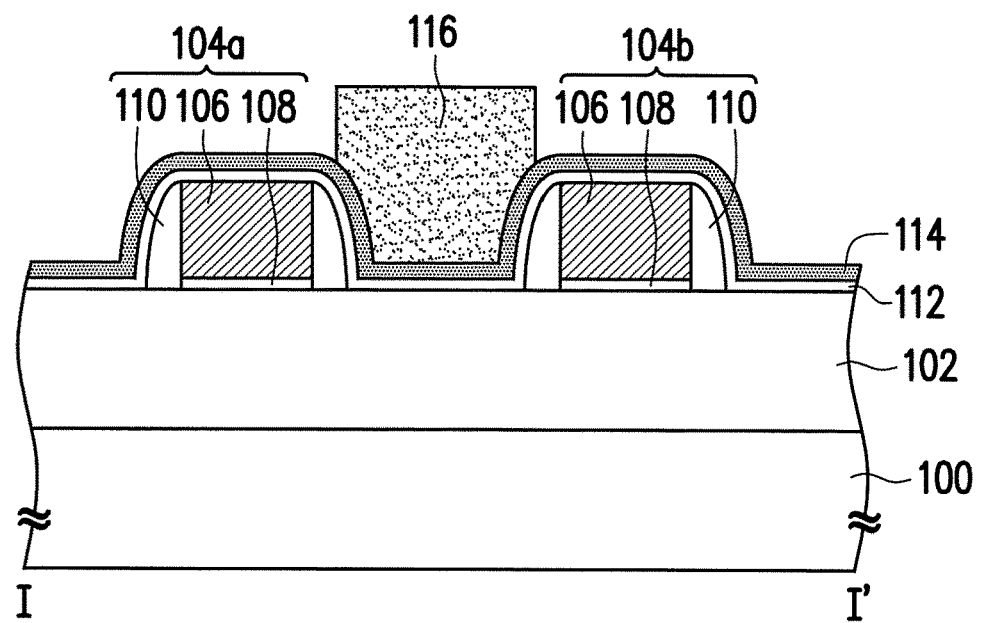

With reference to FIG. 1B, a buffer material layer 112 can be optionally formed on the gate structure 104a and the gate structure 104b conformally. The buffer material layer 112 covers the isolation structure 102. A material of the buffer material layer 112 is, for example, a silicon oxide. A method for forming the buffer material layer 112 is, for example, a chemical vapor deposition method.

A protection material layer 114 can be formed on the buffer material layer 112 conformally. The protection material layer 114 covers the isolation structure 102. A material of the protection material layer 114 includes a silicon nitride or a silicon oxynitride. A method for forming the protection material layer 114 is, for example, a chemical vapor deposition method.

The protection material layer 114 can be a self-aligned silicide block layer. That is to say, the protection material layer 114 can be integrated to be simultaneously manufactured in the manufacturing process for the self-aligned silicide block layer so as to reduce complexity and manufacturing costs in the manufacturing process, but the invention is not limited thereto. In other embodiments, the protection material layer 114 may also be manufactured by a manufacturing process different from that of the self-aligned silicide block layer.

Figure 2A:
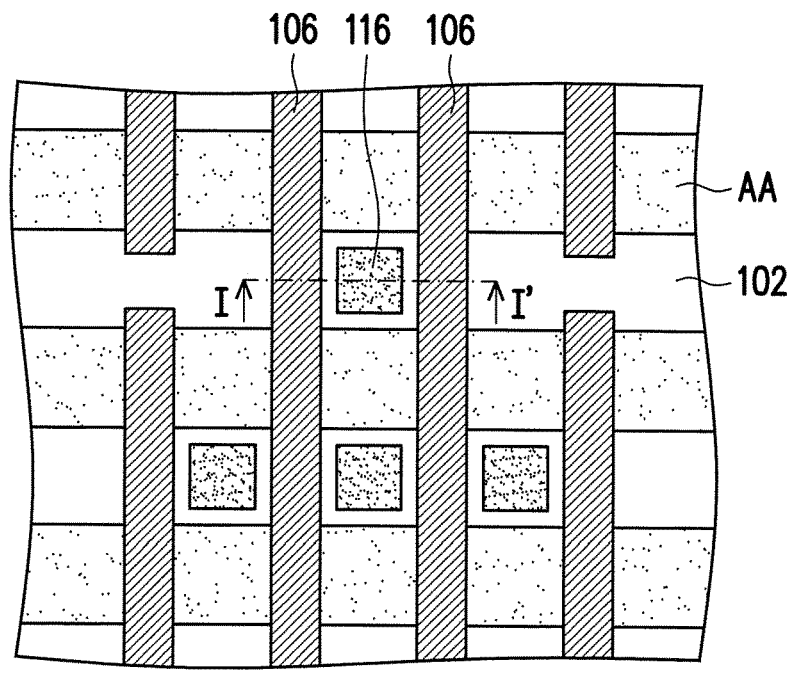
FIG. 2A is a top view of FIG. 1B.

FIG. 2A is a top view of FIG. 1B, and FIG. 1B is a cross-sectional view of FIG. 2A along a sectional line I-I'. In FIG. 2A, for clear description, only the isolation structure 102, the conductive layer 106, a patterned photoresist layer 116 and an active area AA are illustrated.

Referring to FIG. 1B and FIG. 2A together, the patterned photoresist layer 116 is formed on the protection material layer 114 between the gate structure 104a and the gate structure 104b. A material of the patterned photoresist layer 116 is, for example, a positive photoresistor or a negative photoresistor. A method for forming the patterned photoresist layer 116 is, for example, a lithography method. In addition, the patterned photoresist layer 116 does not cover any active area AA in a semiconductor device area predetermined for forming a metal silicide, for example.

Figure 1C:
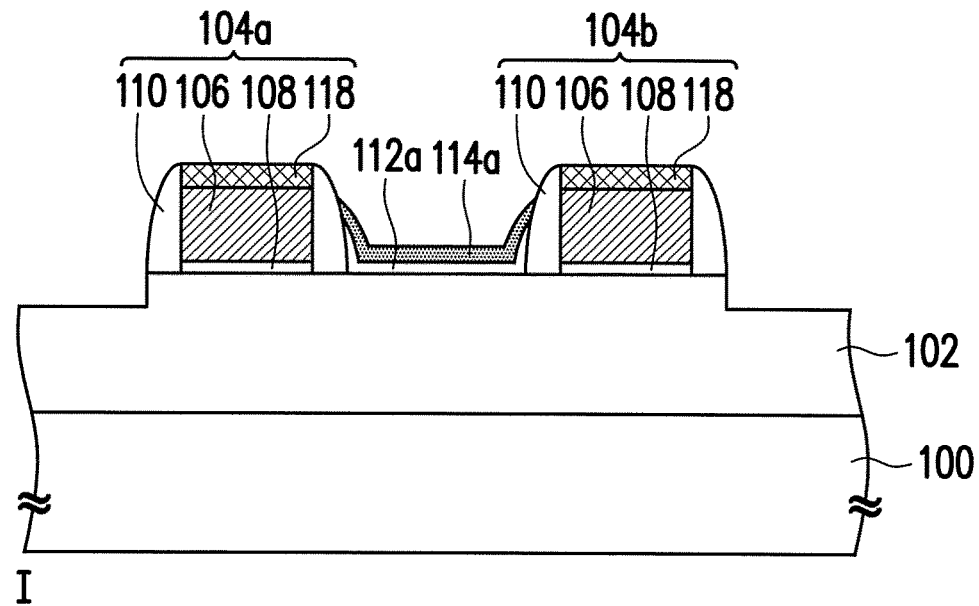
Figure 2B:
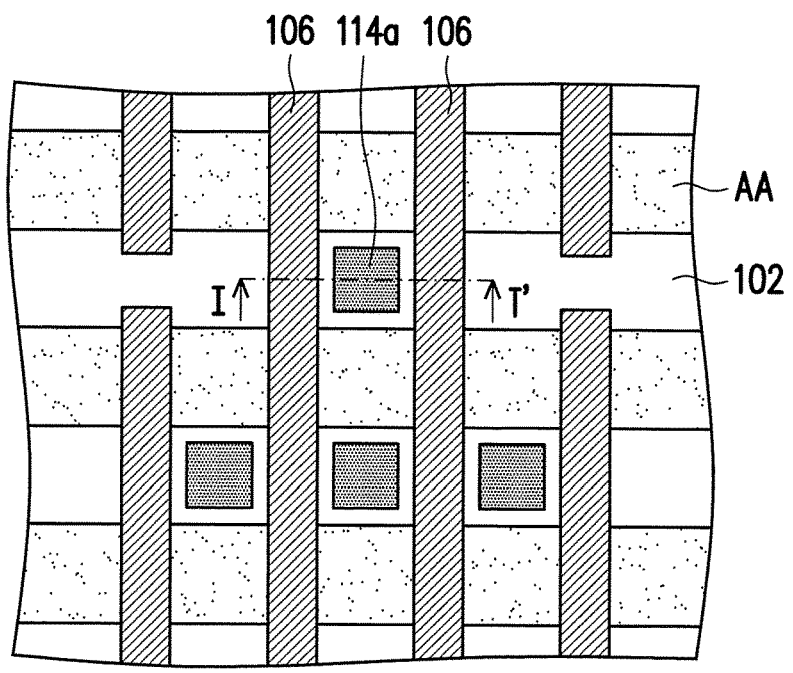
FIG. 2B is a top view of FIG. 1C.

FIG. 2B is a top view of FIG. 1C, and FIG. 1C is a cross-sectional view of FIG. 2B along a sectional line I-I'. In FIG. 2B, for clear description, only the isolation structure 102, the conductive layer 106, a protection layer 114a and the active area AA are illustrated.

Referring to FIG. 1C and FIG. 2B, the protection material layer 114 not covered by the patterned photoresist layer 116 is removed such that the protection layer 114a is formed between the gate structure 104a and the gate structure 104b. The protection layer 114a covers the isolation structure 102 between the gate structure 104a and the gate structure 104b, and can further cover a sidewall of the gate structure 104a and a sidewall of the gate structure 104b. A shape of the protection layer 114a is, for example, a saddle shape. A method for removing the protection material layer 114 not covered by the patterned photoresist layer 116 is, for example, a dry etching method.

In the semiconductor device area predetermined for forming the metal silicide, because the patterned photoresist layer 116 is only formed on the protection material layer 114 between the gate structure 104a and the gate structure 104b, the protection layer 114a is formed only between the gate structure 104a and the gate structure 104b after the manufacturing process for removing the protection material layer 114. That is to say, the protection layer 114a is disposed only between the gate structure 104a and the gate structure 104b in the semiconductor device area predetermined for foaming the metal silicide.

The protection layer 114a does not cover a top portion of the gate structure 104a and a top portion of the gate structure 104b in the semiconductor device area predetermined for forming the metal silicide, for example. A top portion of the protection layer 114a is, for example, lower than the top portion of the gate structure 104a and the top portion of the gate structure 104b. In this way, the protection layer 114a will not interfere with the subsequent process for manufacturing the metal silicide on the conductive layer 106.

In addition, the protection layer 114a does not cover any active area AA in the semiconductor device area predetermined for forming the metal silicide, for example. In this way, the protection layer 114a will not interfere with the subsequent process for manufacturing the metal silicide on the active area AA.

A buffer layer 112a can be formed by removing the buffer material layer 112 not covered by the patterned photoresist layer 116. A method for removing the buffer material layer 112 not covered by the patterned photoresist layer 116 is, for example, a dry etching method.

The patterned photoresist layer 116 is removed. A method for removing the patterned photoresist layer 116 includes, for example, a dry photoresist stripping method or a wet photoresist stripping method.

A metal silicide layer 118 is formed on the conductive layer 106. A material of the metal silicide layer 118 is, for example, a nickel silicide (NiSi) or a cobalt silicide (CoSi$_2$). A method for forming the metal silicide layer 118 is, for example, a self-aligned silicide manufacturing method.

Further, after above manufacturing steps are completed, a top surface of the isolation structure 102 covered by the protection layer 114a is, for example, higher than a top surface of the isolation structure 102 not covered by the protection layer 114a.

The semiconductor structure for preventing generation of void of the present embodiment is described below with reference to FIG. 1C.

Referring to FIG. 1C, the semiconductor structure for preventing generation of void includes the substrate 100, the isolation structure 102, the gate structure 104a, the gate structure 104b and the protection layer 114a. The isolation structure 102 is disposed on the substrate 100. The gate structure 104a and the gate structure 104b are adjacent to each other and disposed on the isolation structure 102. Each of the gate structure 104a and the gate structure 104b includes the conductive layer 106. In addition, each of the gate structure 104a and the gate structure 104b can further include at least one of the dielectric layer 108, the spacer 110 and the metal silicide layer 118. The dielectric layer 108 is disposed between the conductive layer 106 and the isolation structure 102. The spacer 110 is disposed on a sidewall of the conductive layer 106. The metal silicide layer 118 is disposed on the conductive layer 106. The protection layer 114a is disposed between the gate structure 104a and the gate structure 104b, covering the isolation structure 102 between the gate structure 104a and the gate structure 104b, and can further cover the sidewall of the gate structure 104a and the sidewall of the gate structure 104b. The protection layer 114a can be the self-aligned silicide block layer. In addition, the semiconductor structure for preventing generation of void may further include the buffer layer 112a. The buffer layer 112a is disposed between the protection layer 114a and the isolation structure 102. Furthermore, materials, characteristics, forming method and disposing method regarding each component in the semiconductor structure for preventing generation of void have been described in detail in the foregoing embodiments, which are not repeated hereinafter.

In view of the foregoing embodiments, in the semiconductor structure for preventing generation of void and the method for manufacturing the same, the protection layer 114a is disposed between the gate structure 104a and the gate structure 104b, and covers the isolation structure 102 between the gate structure 104a and the gate structure 104b. Therefore, the protection layer 114a can protect the isolation structure 102 therebelow to prevent the isolation structure 102 between the gate structure 104a and the gate structure 104b from being removed. Accordingly, the protection layer 114a can effectively prevent the aspect ratio of the space between the gate structure 104a and the gate structure 104b from becoming greater to prevent generation of void and seam in the film layers formed in aforesaid space, so as to prevent the short circuit between the contacts.

Figure 1D:
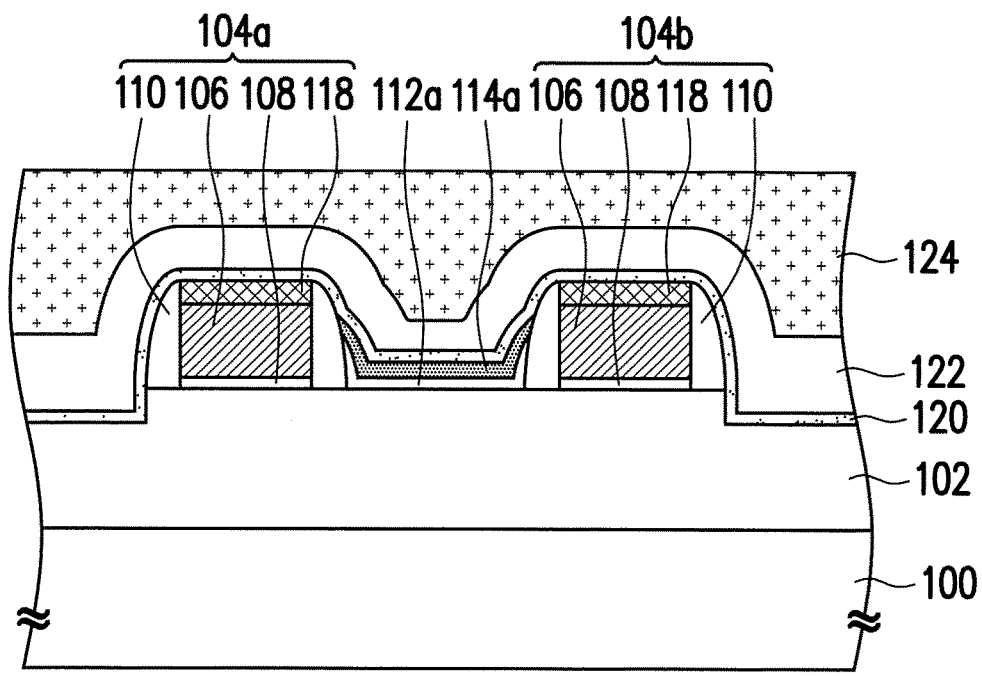

For instance, with reference to FIG. 1D, a buffer layer 120, a contact etch stop layer 122 and a dielectric layer 124 can be optionally formed in sequence to cover the gate structure 104a and the gate structure 104b. A material of the buffer layer 120 is, for example, a silicon oxide. A method for foiling the dielectric layer 120 is, for example, a chemical vapor deposition method. A material of the contact etch stop layer 122 may be, for example, a silicon nitride. A method for forming the contact etch stop layer 122 may be, for example, a chemical vapor deposition method. The dielectric layer 124 can serve as an interlayer dielectric (ILD) layer. The dielectric layer 124 can be a single layer structure or a multi layer structure. A material of the dielectric layer 124 may be, for example, a silicon oxide such as an undoped silicate glass (USG), a phosphosilicate glass (PSG) or a combination thereof.

In view of FIG. 1D, because the protection layer 114a can effectively prevent the aspect ratio of the space between the gate structure 104a and the gate structure 104b from becoming greater, generation of void or seam can be prevented in the buffer layer 120, the contact etch stop layer 122 and the dielectric layer 124 formed in aforesaid space.

In summary, with the semiconductor structure for preventing generation of void and the method for manufacturing the same according to the foregoing embodiments, the protection layer located between the gate structures can protect the isolation structure therebelow to prevent the aspect ratio of the space between the gate structures form becoming greater. As a result, the protection layer can prevent generation of void or seam in the film layers formed in aforesaid space so as to prevent the short circuit between the contacts.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor structure for preventing generation of void, comprising:
   a substrate;
   an isolation structure, disposed on the substrate;
   a first gate structure and a second gate structure, which are adjacent to each other and disposed on the isolation structure, wherein each of the first gate structure and the second gate structure comprises a conductive layer; and
   a protection layer, disposed between the first gate structure and the second gate structure, and covering the isolation structure between the first gate structure and the second gate structure,
   wherein the protection layer comprises a self-aligned silicide block layer.

2. The semiconductor structure for preventing generation of void according to claim 1, wherein the isolation structure comprises a shallow-trench isolation structure.

3. The semiconductor structure for preventing generation of void according to claim 1, wherein each of the first gate structure and the second gate structure further comprises a dielectric layer, disposed between the conductive layer and the isolation structure.

4. The semiconductor structure for preventing generation of void according to claim 1, wherein each of the first gate structure and the second gate structure further comprises a spacer, disposed on a sidewall of the conductive layer.

5. The semiconductor structure for preventing generation of void according to claim 1, wherein each of the first gate structure and the second gate structure further comprises a metal silicide layer, disposed on the conductive layer.

6. The semiconductor structure for preventing generation of void according to claim 1, wherein a material of the protection layer comprises a silicon nitride or a silicon oxynitride.

7. semiconductor structure for preventing generation of void according to claim 1, wherein a shape of the protection layer comprises a saddle shape.

8. The semiconductor structure for preventing generation of void according to claim 1, wherein a top surface of the isolation structure covered by the protection layer is higher than a top surface of the isolation structure not covered by the protection layer.

9. The semiconductor structure for preventing generation of void according to claim 1, wherein the protection layer further covers a sidewall of the first gate structure and a sidewall of the second gate structure.

10. The semiconductor structure for preventing generation of void according to claim 1, wherein the protection layer does not cover a top portion of the first gate structure and a top portion of the second gate structure in a semiconductor device area predetermined for forming a metal silicide.

11. The semiconductor structure for preventing generation of void according to claim 1, wherein a top portion of the protection layer is lower than a top portion of the first gate structure and a top portion of the second gate structure.

12. The semiconductor structure for preventing generation of void according to claim 1, wherein the protection layer does not cover any active area in a semiconductor device area predetermined for forming a metal silicide.

13. The semiconductor structure for preventing generation of void according to claim 1, further comprising:
   a buffer layer, disposed between the protection layer and the isolation structure.

14. A method for manufacturing semiconductor structure for preventing generation of void, comprising:
   forming an isolation structure on a substrate;
   forming a first gate structure and a second gate structure adjacent to each other on the isolation structure, wherein each of the first gate structure and the second gate structure comprises a conductive layer; and
   forming a protection layer between the first gate structure and the second gate structure, wherein the protection layer covers the isolation structure between the first gate structure and the second gate structure,
   wherein the protection layer comprises a self-aligned silicide block layer.

15. The method for manufacturing semiconductor structure for preventing generation of void according to claim 14, wherein a method for forming the protection layer comprises:
   forming a protection material layer conformally on the first gate structure and the second gate structure, wherein the protection material layer covers the isolation structure;
   forming a patterned photoresist layer on the protection material layer between the first gate structure and the second gate structure; and
   removing the protection material layer not covered by the patterned photoresist layer.

16. The method for manufacturing semiconductor structure for preventing generation of void according to claim 15, wherein the patterned photoresist layer does not cover any active area in a semiconductor device area predetermined for forming a metal silicide.

17. The method for manufacturing semiconductor structure for preventing generation of void according to claim 15, wherein a method for removing the protection material layer not covered by the patterned photoresist layer comprises a dry etching method.

18. The method for manufacturing semiconductor structure for preventing generation of void according to claim 15, further comprising:
   forming a buffer material layer on the first gate structure and the second gate structure conformally before forming the protection material layer, wherein the buffer material layer covers the isolation structure.

19. The method for manufacturing semiconductor structure for preventing generation of void according to claim 18, further comprising:
removing the buffer material layer not covered by the patterned photoresist layer to form a buffer layer.

* * * * *